(12) United States Patent
Faue et al.

(10) Patent No.: US 7,251,172 B2
(45) Date of Patent: Jul. 31, 2007

(54) EFFICIENT REGISTER FOR ADDITIVE LATENCY IN DDR2 MODE OF OPERATION

(75) Inventors: Jon Allan Faue, Colorado Springs, CO (US); Craig Barnett, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 11/071,852

(22) Filed: Mar. 3, 2005

(65) Prior Publication Data

US 2006/0209618 A1  Sep. 21, 2006

(51) Int. Cl.
  *G11C 8/00*  (2006.01)
  *G11C 7/00*  (2006.01)
  *G11C 7/10*  (2006.01)
(52) U.S. Cl. .................. 365/194; 365/233; 365/189.05; 365/230.08
(58) Field of Classification Search ................. 365/233, 365/194, 189.05, 230.08
  See application file for complete search history.

(56) References Cited

U.S. PATENT DOCUMENTS

| | | | |
|---|---|---|---|
| 6,169,702 B1 * | 1/2001 | Hoang et al. .......... | 365/230.06 |
| 6,205,062 B1 * | 3/2001 | Kim et al. .................. | 365/193 |
| 6,320,819 B2 * | 11/2001 | Tomita et al. ............... | 365/233 |
| 6,434,082 B1 | 8/2002 | Hovis et al. | |
| 6,504,767 B1 * | 1/2003 | Brown .................. | 365/189.05 |
| 6,542,416 B1 | 4/2003 | Hampel et al. | |
| 6,647,560 B1 | 11/2003 | Hingley et al. | |
| 6,757,857 B2 | 6/2004 | Lamb et al. | |
| 6,822,924 B2 * | 11/2004 | Lee ........................... | 365/233 |
| 6,832,177 B2 | 12/2004 | Khandekar et al. | |
| 7,054,222 B2 * | 5/2006 | Li et al. ...................... | 365/233 |
| 7,061,823 B2 * | 6/2006 | Faue et al. ............ | 365/230.08 |
| 2004/0081012 A1 * | 4/2004 | Setogawa ................... | 365/233 |

* cited by examiner

*Primary Examiner*—Amir Zarabian
*Assistant Examiner*—Michael Weinberg
(74) *Attorney, Agent, or Firm*—Peter J. Meza; William J. Kubida; Hogan & Hartson LLP

(57) ABSTRACT

An additive latency circuit for a DDR2 standard compliant integrated circuit memory includes a half flip-flop register assigned for each case of additive latency. A unique clock is generated to control each bit in the register chain. Sufficient register bits are required in the chain to support the highest additive latency specified. For latency settings less than the maximum, those clocks assigned to the bits above the chosen latency are enabled so the data passes through un-clocked. For the additive latency zero case, a separate bypass path is provided. Both address and command information is delayed by the additive latency delay chain. Once delayed by the proper number of cycles, the address information remains in that state until the time when a new state is required. Command information remains valid for one cycle upon reaching the proper delay point. A reset circuit is provided to reset command signals.

15 Claims, 11 Drawing Sheets

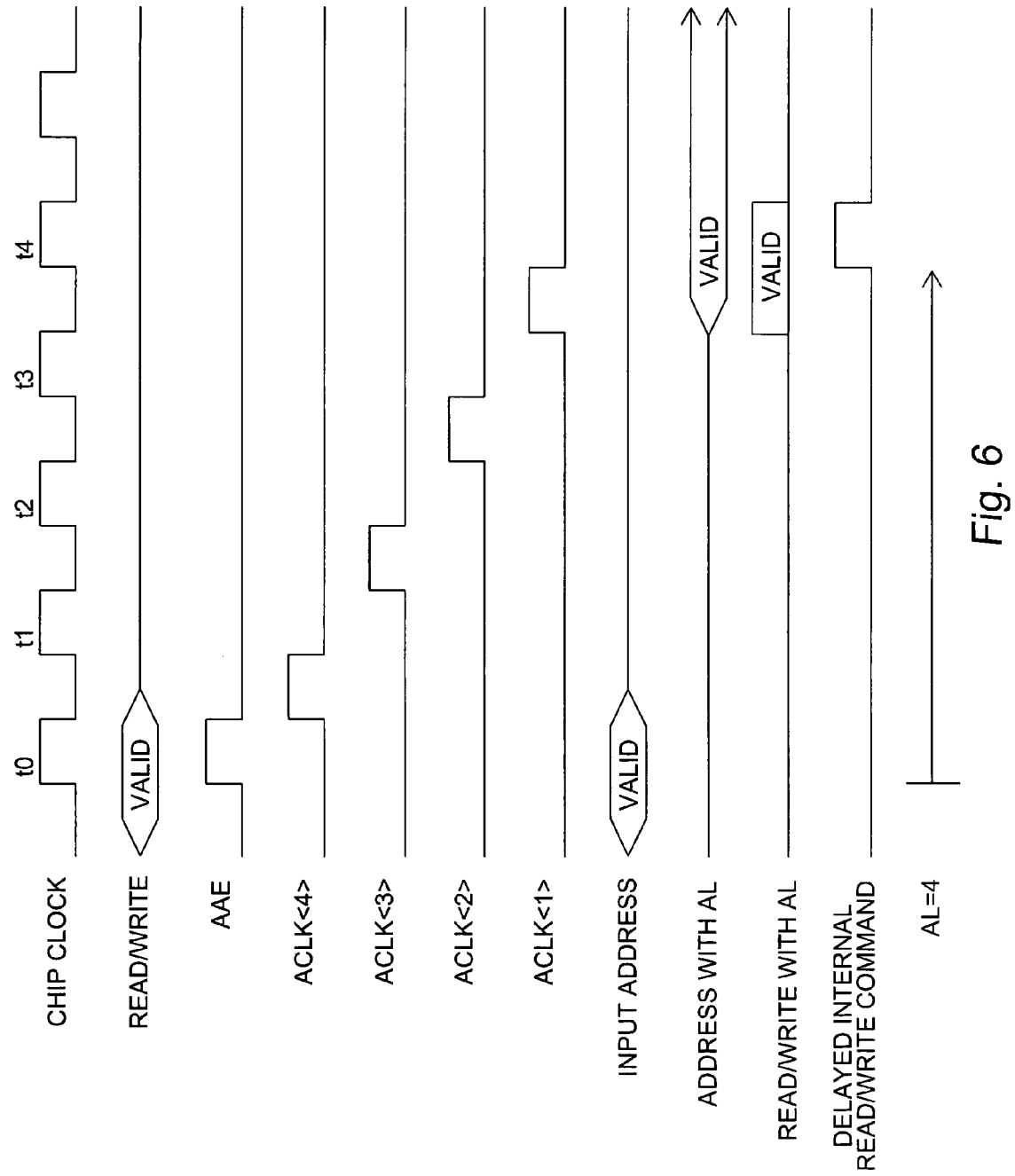

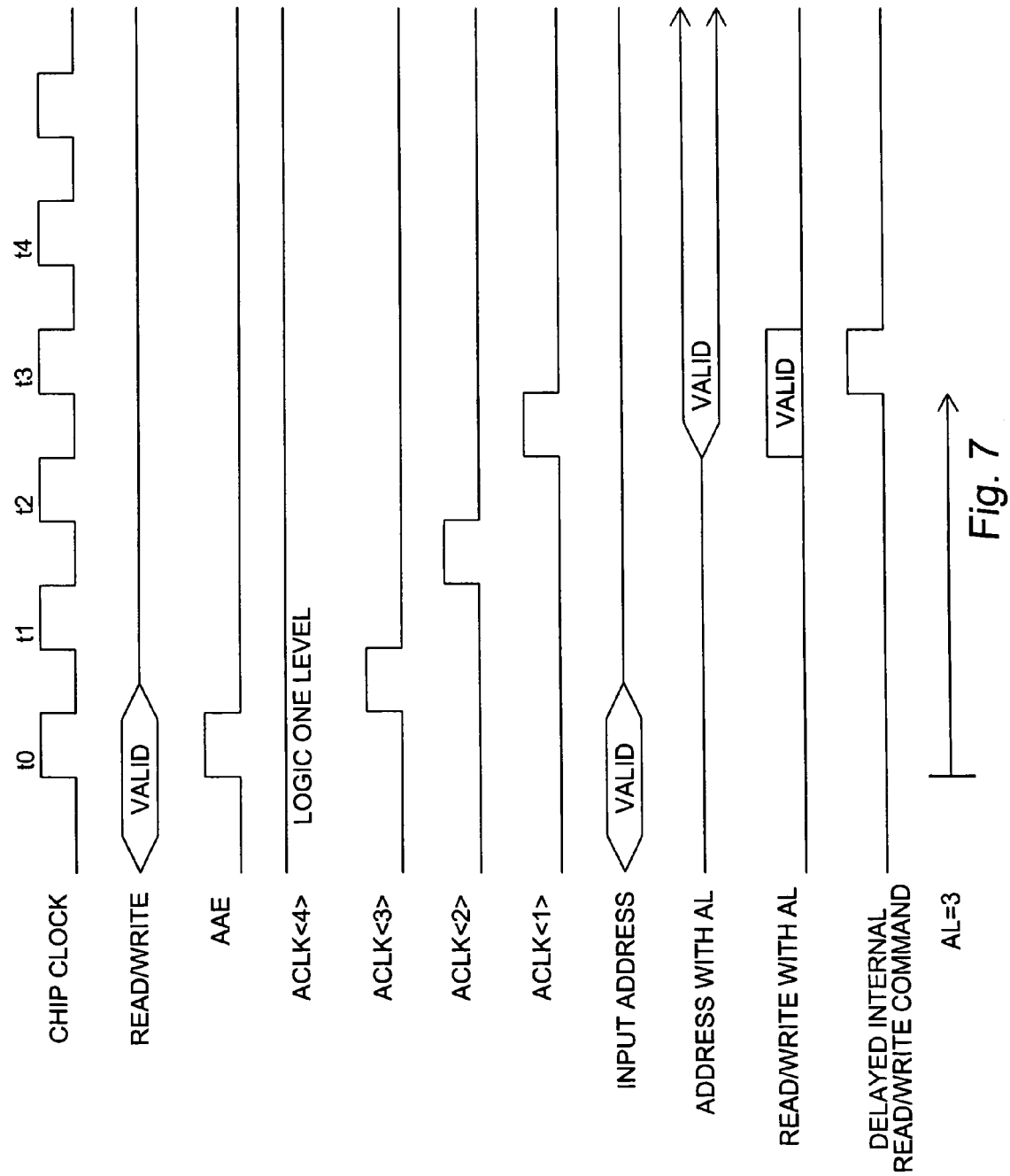

United States Patent US 7,251,172 B2

EFFICIENT REGISTER FOR ADDITIVE LATENCY IN DDR2 MODE OF OPERATION

BACKGROUND OF THE INVENTION

The present invention relates to integrated circuits and, more particularly, to a circuit and method for adding latency into the address and command signal paths of an integrated circuit memory operating according to the DDR2 standard.

Additive latency is a modification introduced into the DDR2 standard. It is designed to minimize instruction scheduler idles during data transmission to/from the memory. While additive latency is required by the DDR2 standard, known circuits for providing additive latency have serious drawbacks that could impact the performance enhancements provided by the DDR2 standard. These circuits fall into two general categories. A parallel-based circuit and method places too much loading on the eventual output path of the circuit. A series-based circuit minimizes output loading but the circuit and method is too slow. Other drawbacks of known additive latency circuits include variable time delays and changes in performance over time, temperature, and variability due to process conditions.

What is desired is a circuit and method that can provide the additive latency required by the DDR2 standard, yet does not place too much loading on the output of the circuit and is fast enough to be implemented in a DDR2 compliant integrated circuit memory.

SUMMARY OF THE INVENTION

According to an embodiment of the present invention, an additive latency circuit and method for a DDR2 standard compliant integrated circuit memory achieves a compromise in speed versus loading on the final output path. An embodiment of the additive latency circuit and method is implemented with a very reduced number of transistors, thereby desirably reducing the integrated circuit area required. Rather than continually shifting an address (or command) by one full DQ flip-flop type register every cycle, a half flip-flop register is assigned for each case of additive latency. Rather than clock the additive latency chain with a common clock signal, a unique clock is generated to control each bit in the chain, according to an embodiment of the present invention.

In the DDR2 standard, new READ or WRITE commands cannot be issued on successive cycles. As long as the clocks assigned to two adjacent bits in the latency register chain are not valid at the same time, data will be correctly clocked through. Sufficient register bits are required in the chain to support the highest additive latency specified for the part. For latency settings less than the maximum, those clocks assigned to the bits above the chosen latency are enabled in the "ON" state so the data passes through un-clocked. The AL<0> case (additive latency is equal to zero) is somewhat special in that it is very speed sensitive, so a separate bypass path is provided for this case according to an embodiment of the present invention.

Both address and command information is delayed by the additive latency delay chain. Once delayed by the proper number of cycles, the address information remains in that state until the time when a new state is required. However, the command information can only remain valid for one cycle upon reaching the proper delay point. Special provisions are provided according to an embodiment of the invention to reset command signals so they only remain valid for one cycle.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 6 is a timing diagram showing various timing signals for a desired additive latency of four;

FIG. 7 is a timing diagram showing various timing signals for a desired additive latency of three;

DETAILED DESCRIPTION

Figure 1:
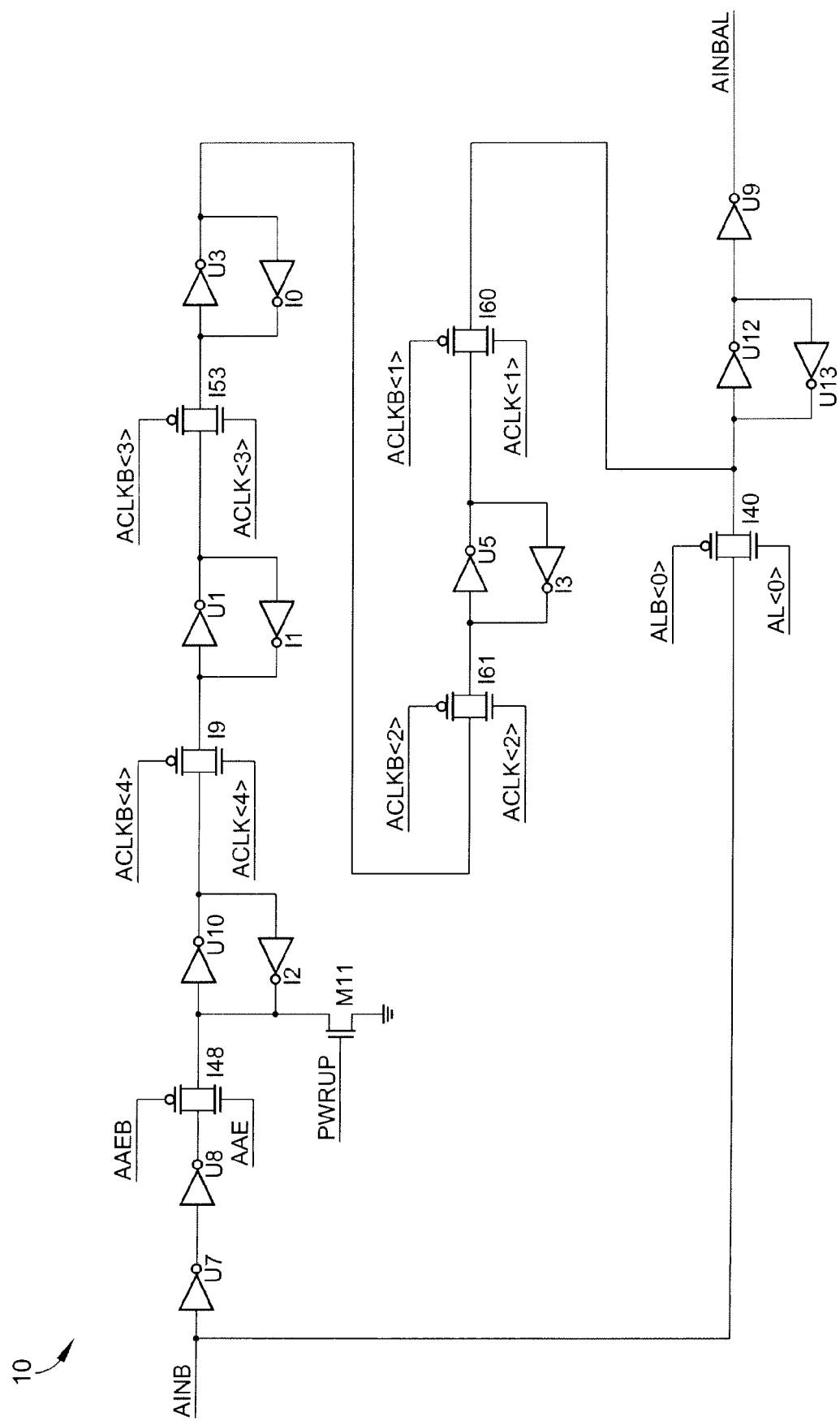
FIG. 1 is a schematic diagram of an additive latency circuit for address signals according to the present invention.

Referring now to FIG. 1, a schematic diagram of an additive latency circuit 10 for address signals according to an embodiment of the present invention is shown. Circuit 10 includes four "half-latch" stages or register bits each including a transmission gate and a cross-coupled latch. Each half-latch stage also receives a unique clock and inverted clock signal. For example, the half-latch stage that is used to provide an additive latency of four includes transmission gate I9 and latch U10, as well as unique clock signals ACLK<4> and ACLKB<4>. The half-latch stage that is used in providing an additive latency of three (or more) includes transmission gate I53 and latch U1, as well as unique clock signals ACLK<3> and ACLKB<3>. The half-latch stage that is used in providing an additive latency of two (or more) includes transmission gate I61 and latch U3, as well as unique clock signals ACLK<2> and ACLKB<2>. The half-latch stage that is used in providing an additive latency of one (or more) includes transmission gate I60 and latch U5, as well as unique clock signals ACLK<1> and ACLKB<1>. Note the position of the half-latch stages. The half-latch stages associated with increasing additive latency are closer to the beginning of the chain of register bits, and the half-latch stages associated decreasing additive latency are closer to the ending of the chain of register bits.

Circuit 10 also includes inverters U7 and U8, as well as transmission gate 148. Transmission gate receives the AAEB and AAE signals, which are initialization signals as is explained in further detail below. Transistor M11 is coupled to the chain of register bits and receives the PWRUP signal, which is also used to initialize operation. The address input signal to circuit 10 is designated AINB which stands for "Address INput Bar", or the inverted address input signal.

For the case in which no additive latency is required, a bypass circuit is provided, which includes transmission gate 140, and unique clock signals ALB<0> and Al<0>, as well as latch U12/U13 and inverter U9. The output signal of circuit 10 is designated AINBAL, which stands for "Address INput Bar Additive Latency". The output signal of circuit 10 is a time-shifted copy of the input address signal, which is shifted by either one, two, three, or four clock periods, as may be required in compliance with the DDR2 standard.

Figure 2:
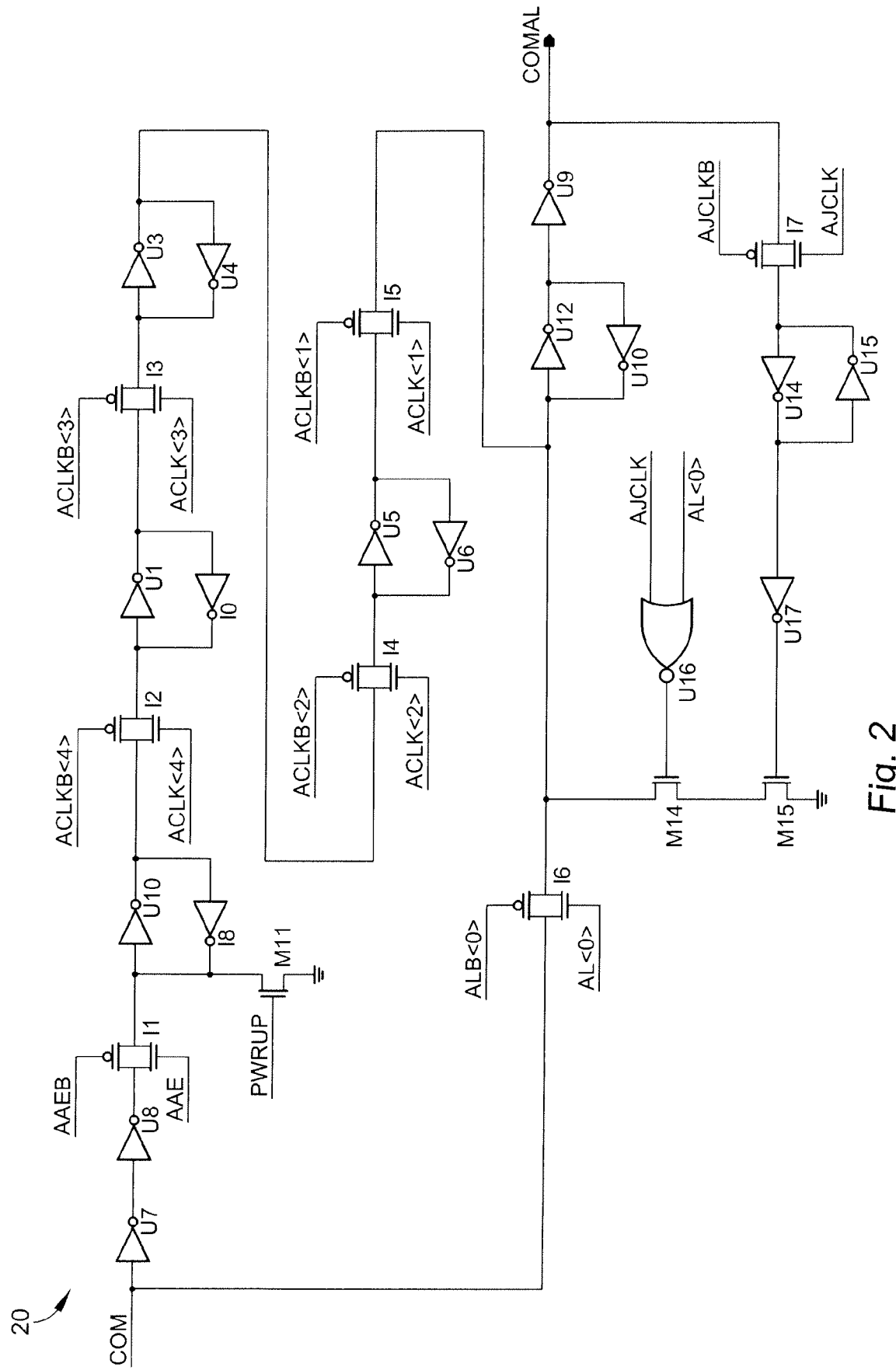
FIG. 2 is a schematic diagram of an additive latency circuit for command signals according to the present invention, which includes a special reset circuit.

Referring now to FIG. 2, a schematic diagram of an additive latency circuit 20 for command signals according to an embodiment of the present invention, which includes a special reset circuit, is shown. Circuit 20 also receives four "half-latch" stages or register bits each including a transmission gate and a cross-coupled latch as previously described with respect to FIG. 1. Each half-latch stage also includes a unique clock and inverted clock signal. For example, the half-latch stage that is used to provide an additive latency of four includes transmission gate I2 and latch U10, as well as unique clock signals ACLK<4> and ACLKB<4>. The half-latch stage that is used in providing an additive latency of three (or more) includes transmission gate I3 and latch U1, as well as unique clock signals ACLK<3> and ACLKB<3>. The half-latch stage that is used in providing an additive latency of two (or more) includes transmission gate I4 and latch U3, as well as unique clock signals ACLK<2> and ACLKB<2>. The half-latch stage that is used in providing an additive latency of one (or more) includes transmission gate I5 and latch U5, as well as unique clock signals ACLK<1> and ACLKB<1>. Note the position of the half-latch stages. The half-latch stages associated with increasing additive latency are closer to the beginning of the chain of register bits, and the half-latch stages associated decreasing additive latency are closer to the ending of the chain of register bits.

Circuit 20 also includes inverters U7 and U8, as well as transmission gate I1. Transmission gate receives the AAEB and AAE signals, which are initialization control signals. Transistor M11 is coupled to the chain of register bits and receives the PWRUP signal, which is also used in initializing operation. The address input signal to circuit 20 is designated COM which stands for "COMmand", or the command input signal.

For the case in which no additive latency is required, a bypass circuit is provided, which includes transmission gate 16, and unique clock signals ALB<0> and Al<0>, as well as latch U12/U10 and inverter U9. The output signal of circuit 10 is designated COMAL, which stands for "COMmand Additive Latency". The output signal of circuit 20 is a time-shifted copy of the input command signal, which is shifted by either one, two, three, or four clock periods, as may be required in compliance with the DDR2 standard.

Circuit 20 also includes a reset circuit, for quickly resetting the delayed command signal, which is only needed for a specific period of time and not thereafter. The reset circuit portion of circuit 20 includes transistors M14 and M15, NOR gate U16, inverter U17, cross-coupled latch U14/U15, and transmission gate I7. The transmission gate receives the COMAL output signal, and is gated by the AJCLK and AJCLKB signals, which are redriven JCLK clock signals. NOR gate U16 receives the AJCLK signal, as well as the additive latency AL<0> unique clock signal.

The operation of circuits 10 and 20 is described in further detail below.

Figure 3:
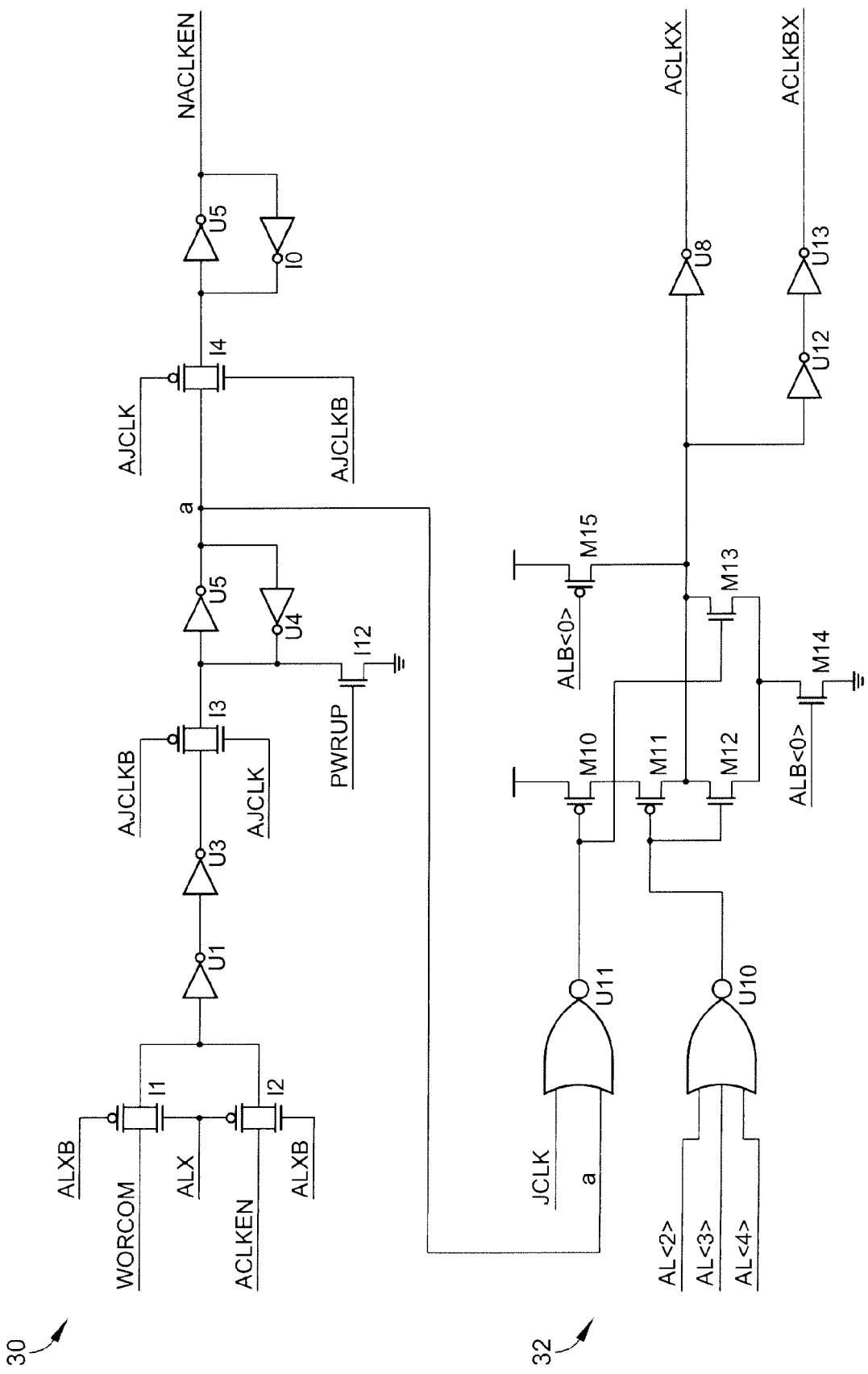
FIG. 3 is a schematic diagram of a clock generator for generating unique clock signals according to the method of the present invention.

Referring now to FIG. 3, a schematic diagram of clock generator circuits 30 and 32 for generating unique clock signals according to the method of the present invention. Clock generator circuit includes transmission gates I1 and I2 for receiving the WORCOM ("Write Or Read COMmand") and ACLKEN ("Additive latency CLock Enable) signals. The WORCOM signal is high if a WRITE, READ, or OCD command is present and the circuit is not in the AL<0> mode. Transmission gates I1 and I2 are gated by the ALX and ALXB signals. The ALX signal is the Additive Latency port that is used by AL<1:4>, wherein "X" refers to an integer used for a particular desired latency. These signals correspond to which particular additive latency the chip is using. For example, AL<1> is additive latency of one. Transmission gates I1 and I2 are coupled to inverters U1 and U3, and then to transmission gate I3. Transmission gate I3 is gated by signals AJCLK and AJCLKB. Transistor I12 is coupled to transmission gate I3, and receives the PWRUP signal at its gate. A latch consisting of inverters U4 and U5 is coupled to the drain of transistor I12. A transmission gate I4 gated by signals AJCLK and AJCLKB and a latch U6/I0 completes the circuit and provides the NACLKEN signal, which is the "Next Additive latency CLock Enable" signal. While shifting the sequence of ACLK(X) signals accordingly, NACLKEN enables the next clock in the sequence for the next clock cycle.

Clock generator circuit 32 includes NOR gates U11 and U10 for receiving the JCLK, "a", AL<2>, AL<3>, and AL<4> signals. The JCLK signal is a fixed width, buffered version of the external clock signal, and the AL<2>, AL<3>, and AL<4> signals are signals representing the additive latency desired. The "a" signal represents the latched inverted state of either WORCOM or NACLEN in the ACLK circuit 30. The outputs of NOR gates U10 and U11 are received by an inverter including transistors M10, M11, M12, M13, M14, and M15. The gate of transistors M14 and M15 receive the ALB<0> signal. The output of the inverter is coupled to inverters U12 and U12 for providing the ACLKBX signal. The output of the inverter is coupled to inverter U8 for providing the ACLKX signal. The ACLKX and ACLKBX signals are the unique clock signals associated with a desired additive latency used in circuits 10 and 20 as previously described.

Figure 4:
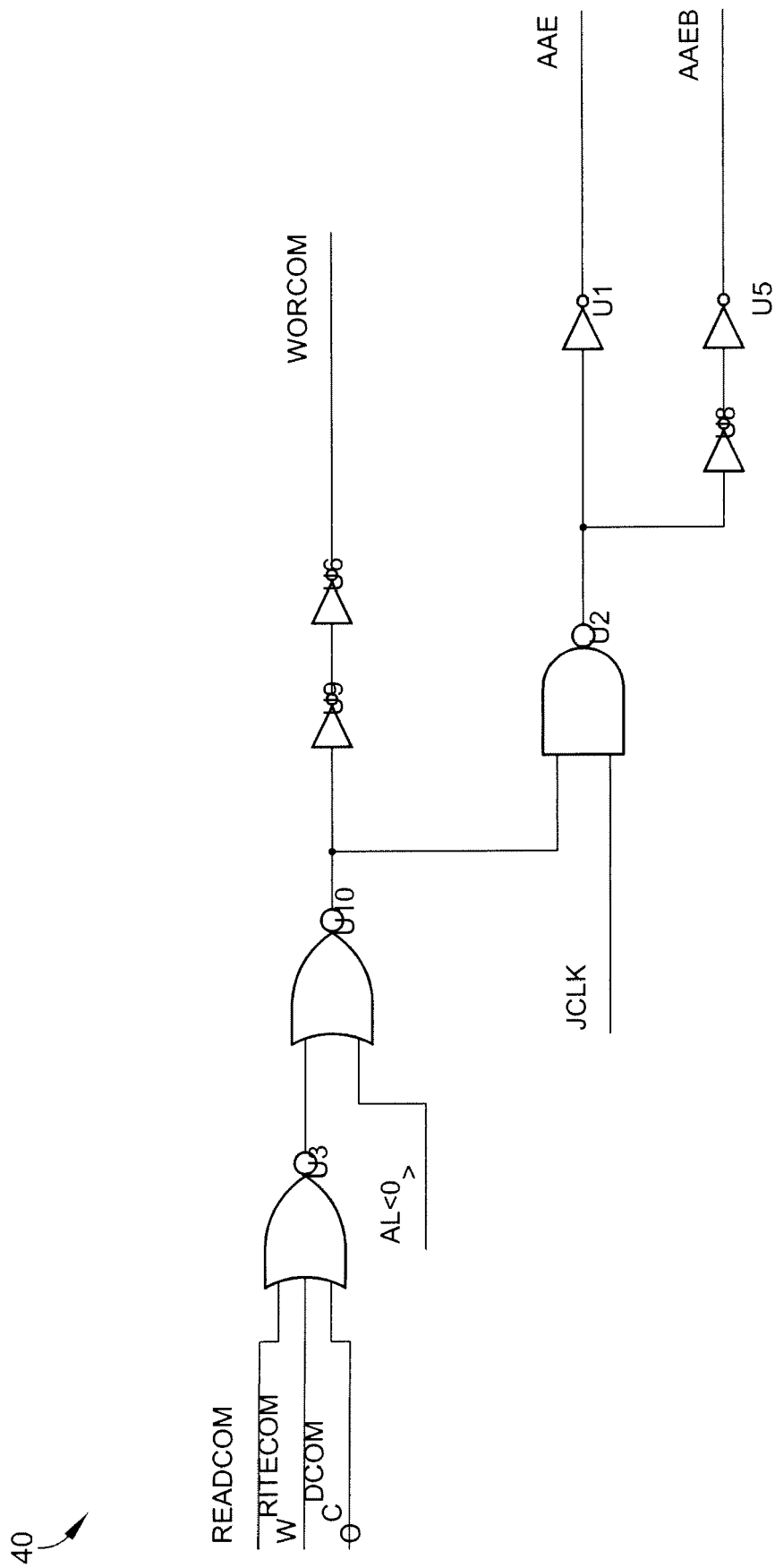
FIG. 4 is a schematic diagram of an initialization circuit for initializing the latency function according to the method of the present invention.

Referring now to FIG. 4, a schematic diagram of an initialization circuit for initializing the latency function according to the method of the present invention. Initialization circuit 40 includes NOR gate U3 for receiving the READCOM ("READ COMmand"), WRITECOM ("WRITE COMmand"), and OCDCOM ("Off Chip Driver COMmand") signals. NOR gate U10 is coupled to the output of NOR gate U3 and also receives the AL<0> signal. NAND gate U2 receives the output of NOR gate U10 and the JCLK signal. Circuit 40 also includes inverters U9 and U6 for generating the WORCOM signal, inverter U1 for generating the AAE signal, and inverters U6 and US for generating the AAEB signal. The WORCOM signal is the "Write Or Read COMmand" signal, the AAE signal is the "Additive latency Address Enable" signal and the AAEB signal is the inverse of the AAE signal.

Figure 5A:
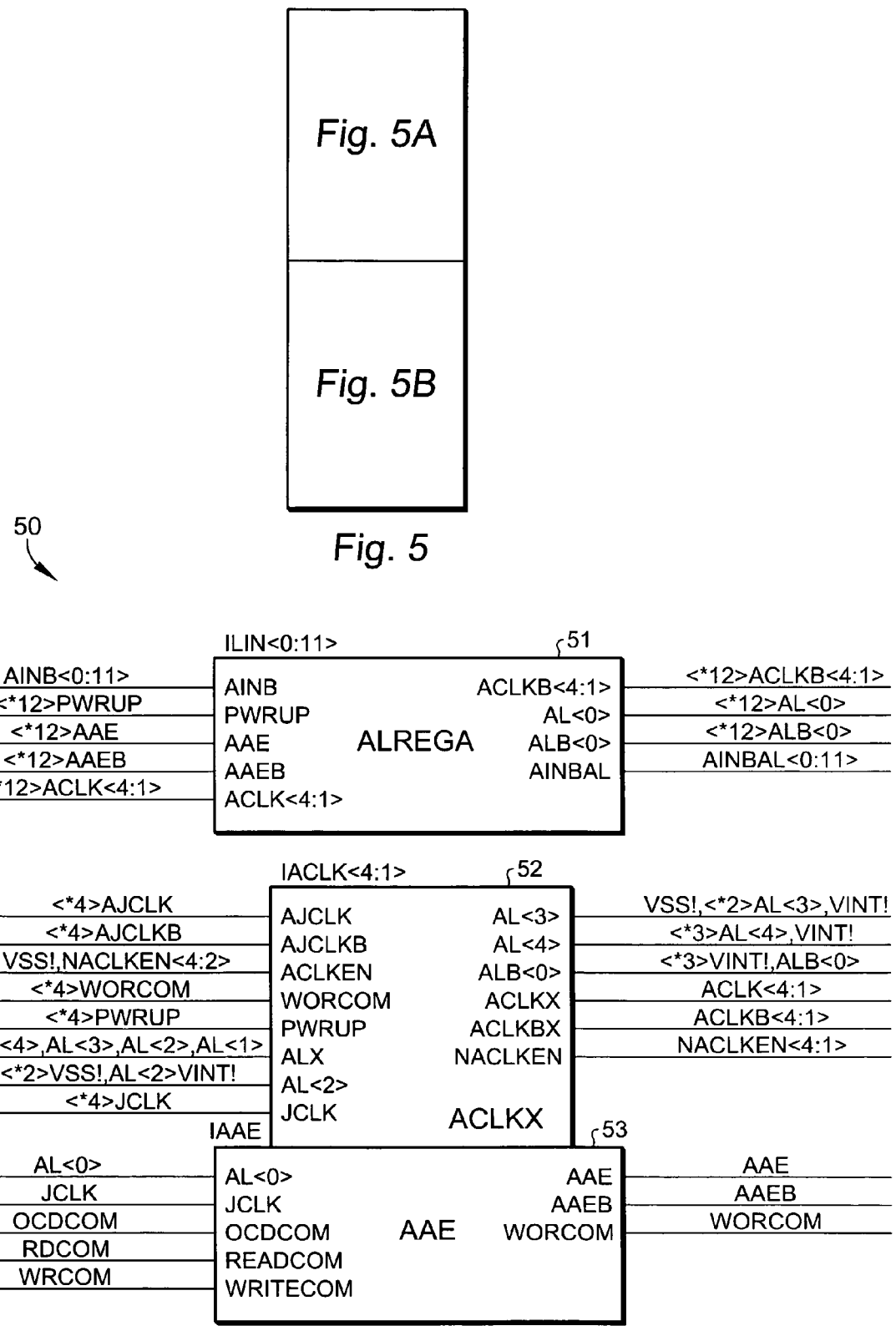
FIG. 5 is a block diagram for the entire additive latency circuit according to an embodiment of the present invention, showing the input, output, and control signals associated with each circuit block.
Figure 5B:
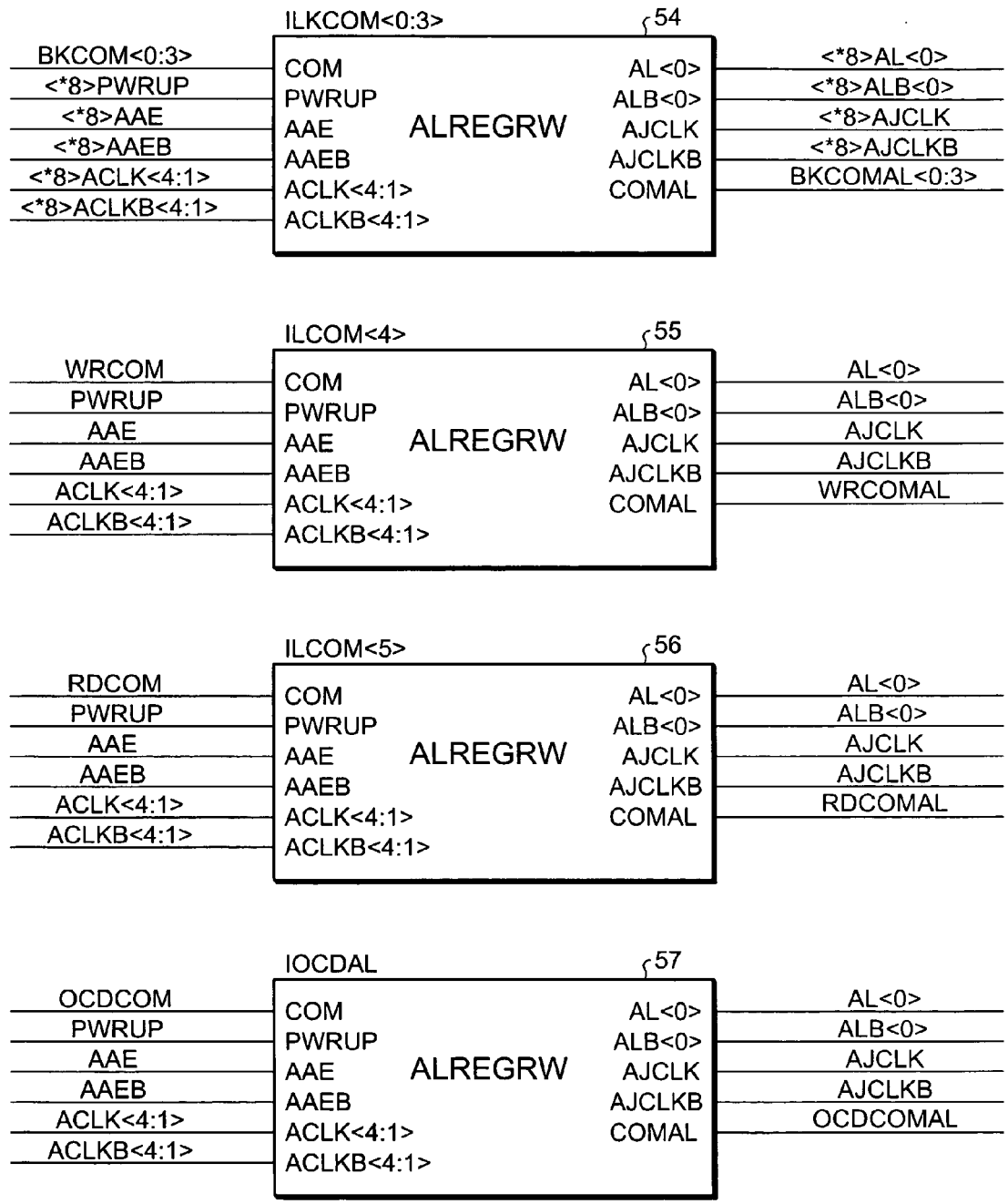
Figure 8:
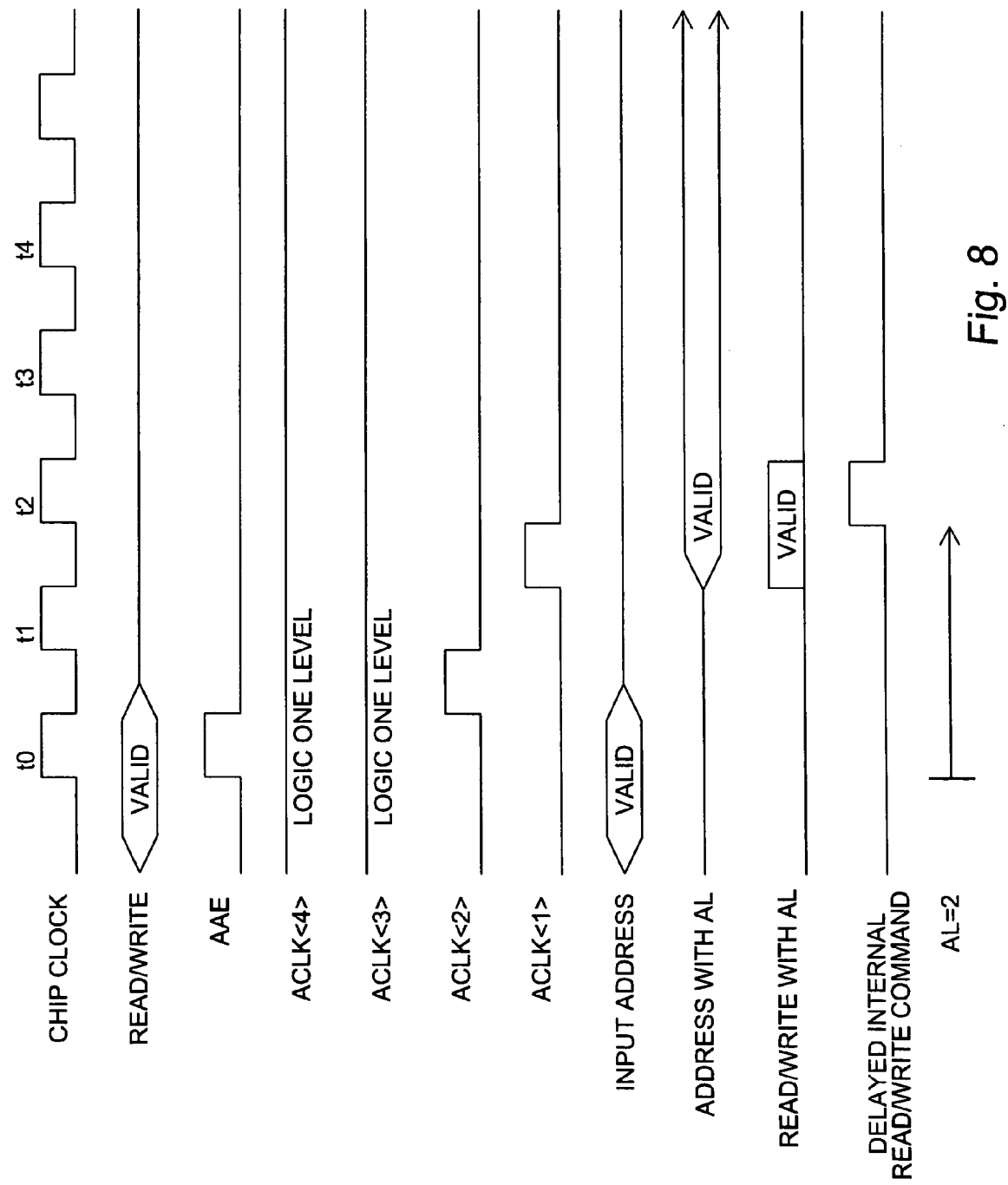
FIG. 8 is a timing diagram showing various timing signals for a desired additive latency of two.
Figure 9:
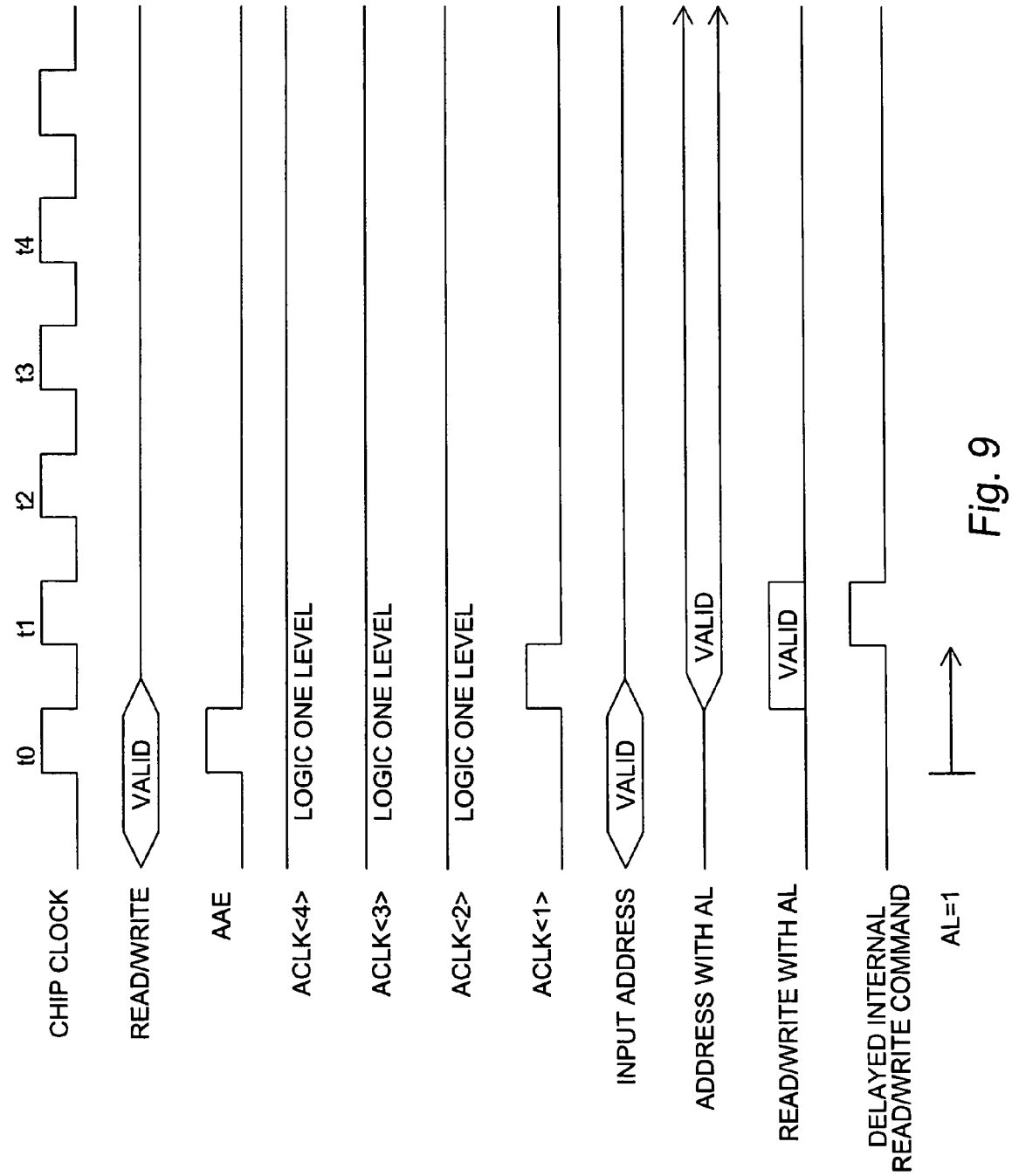
FIG. 9 is a timing diagram showing various timing signals for a desired additive latency of one.

Referring now to FIG. 5, a block diagram 50 for the entire additive latency circuit according to an embodiment of the present invention, shows the input, output, and control signals associated with each circuit block. Block 51 ("AL-REGA") corresponds to circuit 10. This circuit generates the AINBAL<0:11> signals, which are the address signals with the appropriate additive latency applied. There are twelve placements of circuit 10, <0:11>, one for each address input.

Block 52 ("ACLKX") corresponds to circuits 30 and 32. These circuits generate the ACLKX signals, which are timed according to the assigned additive latency. If AL<0>=1 (additive latency equal to zero case), ACLK<1> is forced low. The are four placements, <1:4>, one for each ACLK case. Block 53 ("AAE") corresponds to circuit 40. This circuit generates the WORCOM, AAE, and AAEB signals. The WORCOM signal is an active high if any of the READCOM, WRITECOM, or OCDCOM signals are high. The AAE and AAEB signals are controlled in the same manner except that the pulse width of the signals is dictated by the JCLK signal. The only exception to this is the AL<0> case. For AL<0>, the WORCOM and AAE signals are forced low. Block 54 ("ALREGW") corresponds to circuit 20. This circuit generates the BKCOMAL<0:3> signals. BKCOMAL<0:3> are the BanK COMmand signals with the appropriate Additive Latency applied to them. Blocks 55, 56, and 57 also correspond to circuit 20. Block 55 generates the Write COMmand signal with the appropriate Additive Latency applied to it ("WRCOMAL"). Block 56 generates the Read COMmand signal with the appropriate Additive Latency applied to it ("RDCOMAL"). Block 57 generates the Off Chip Driver COMmand signal with the appropriate Additive Latency applied to it ("OCDCOMAL"). The various input, output, and control signals are shown corresponding to each block node.

The operating method for additive latency is further described below, culminating with an explanation of the timing diagrams of FIGS. 6-9. In operation, the actual execution of a given READ or WRITE command, and the corresponding address, are delayed by a number of clock cycles, referred to as the "additive latency". For AL<4> (additive latency of four), if a READ command is given to the chip at clock=T<0>, the actual read operation inside the chip starts at T<4>. READ and/or WRITE commands can be given every other cycle for DDR2 parts, so the additive latency delay chains have to have the ability of shifting multiple cycles worth of information at the same time. Therefore, each column address, including bank addresses, requires a complete additive latency shift chain. The READ, WRITE, and OCD commands also need shift chains, but with the reset function added.

JCLK is the main internal chip clock, with the frequency the same as the external clock, but Tch (clock high time) is limited to a maximum width. ACLK<x> is a unique clock for each register bit so that the maximum desired additive latency can be controlled. Each bit in the chain is controlled by a specific clock, designated as ACLK.

According to an embodiment of the present invention, the additive latency circuit and method takes advantage of the DDR2 specification which dictates new read/write commands can only be given on alternating cycles. (Minimum BL ("Burst Length")=4, no interrupt allowed, thus each read or write is followed by a dead cycle as far as the column path is concerned. It is important to note that row path activity is still valid on the cycle following a read or write).

According to the present invention, a register bit for each additive latency case (AL<#>) is assigned. These register bits are relatively simple, and formed by half of a full DQ flip-flop (also referred to as a "half-latch".) Each register bit in the chain is controlled by its own unique Aclk<#> (additive latency clock) rather than a common global "CLK".

For additive latency less than "n" [AL<"n"], the Aclk<n> is defaulted high such that that bit is bypassed. Since these register bits are quite simple, the cumulative delay through the register bit chain is tolerable. For AL<n>, Aclk<n> fires on the next clock low period immediately after the read/write command. Aclk<n-1> fires on the next low after that, Aclk<n-2> fires two cycles after, etc. Therefore, for AL<n>, Aclk<n-t> is active on the clock low period <t> cycles after the read/write command. For cases where "n" is greater that the set AL case, Aclk<n>=1, except for Aclk<1> which=0 when AL<0> is set. This is the basic equation for shifting. Since even and odd Aclks never fire on the same cycle, a full DQ flip-flop is not needed thereby minimizing the delay when one or more bits are bypassed. Aclks are active when the chip clock is low, so information can be output and compared with the next chip clock high situation.

Since AL<0> is the most speed critical case, a special bypass path, direct to the output bypassing the entire register chain is provided for that case. For the AL<0> case, Aclk<1> is set to zero so only the AL<0> path is activated. Address information can be shifted through the register and left in its final state indefinitely. However, read or write command information can only be valid for one cycle. Thus a special shift chain is required for the read/write bits that resets itself upon reaching its final latency so the command is only executed once. Also, mostly to save power, the address registers are only loaded coincident with actual read or write commands.

In the present invention, the AL register bits are arranged in descending order. I.e. AL<4> bit is first, then AL<3>, <2>, and finally <1>. The intent was to push the address data as far as possible through the bypassed bits before encountering an actively clocked bit.

The address information cannot be handled the same way as the read or write command information. The address information can be shifted through the registers and remain there in its final state until another address is required. While this is acceptable for the address information, the read and write command information should only be valid for one cycle. The main function of the circuit is to reset itself upon reaching its final latency, so the command is executed only once. This was accomplished by using a delayed version of JCLK (AJCLK) to latch the read or write command. When AJCLK is high, an N-channel device (M14) is used to isolate the command signal and also control a transmission gate that allows the signal to be latched. When AJCLK goes low, the N-channel device (M14) is activated and, along with the latched command signal, resets the read or write command signal to zero. It should also be noted that, for AL<0>, this part of the circuit is disabled.

The equation for shifting according to the present invention is as follows: For AL<n>, Aclk<n-t>is active on the clock low period <t> cycles after read or write command. For cases when "n" is greater than the set AL case, Aclk<n>=1, except for Aclk<1> which equals zero when AL<0> is set.

Referring now to FIGS. 6-9, the following signals are shown for additive delays of four, three, two, and one: CHIP CLOCK, READ/WRITE, AAE, ACLK<4>, ACLK<3>, ACLK<2>, ACLK<1>, INPUT ADDRESS, ADDRESS with Additive Latency, READ/WRITE with Additive Latency, Delayed INTERNAL READ/WRITE command, as well as an indication of the Additive Latency according to the preselected amount of required.

Figure 10:
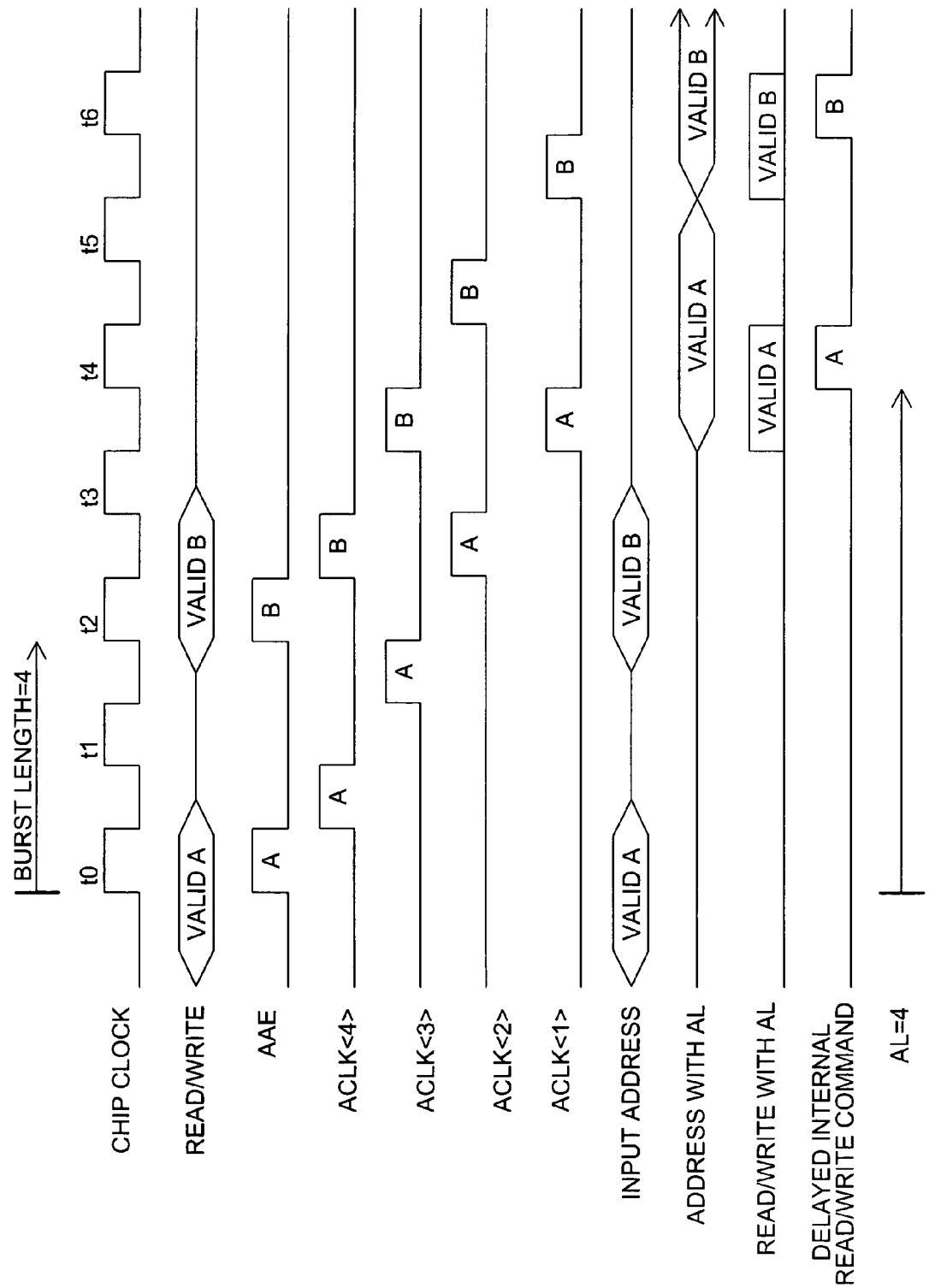
FIG. 10 is a timing diagram similar in nature to the timing diagrams of FIGS. 6-9, but showing a multiple clock case.

The timing diagram of FIG. 10 is also provided, which is similar in nature to the timing diagrams of FIGS. 6-9, but illustrates a multiple clock case.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. An additive latency circuit for an integrated circuit memory comprising a chain of register bits, wherein each register bit is controlled by a unique clock signal, and for latency settings less than a maximum latency setting, those clocks assigned to the bits above a chosen latency are enabled in the "ON" state so signals pass through un-clocked, wherein the unique clock signals are non-overlapping for adjacent register bits, each register bit comprises a half-latch, and the additive latency provided by each half-latch has a duration of more than one-half of a clock cycle.

2. The additive latency circuit of claim 1 further comprising a separate bypass path when no additive latency is required.

3. The additive latency circuit of claim 2 in which the chain of register bits is disabled.

4. The additive latency circuit of claim 1 wherein the chain of register bits comprises a first chain of register bits and a second chain of register bits.

5. The additive latency circuit of claim 4 wherein the first chain of register bits provides additive latency for address signals.

6. The additive latency circuit of claim 4 wherein the second chain of register bits provides additive latency for command signals.

7. The additive latency circuit of claim 6 further comprising a reset circuit.

8. The additive latency circuit of claim 1 wherein each half-latch comprises a full transmission gate coupled to a pair of cross-coupled inverters.

9. A method of providing additive latency in an integrated circuit comprising:

providing a chain of register bits;

controlling each register bit with a unique clock signal; and for latency settings less than a maximum latency setting, those clocks assigned to the bits above a chosen latency are enabled in the "ON" state so signals pass through un-clocked, wherein the unique clock signals are non-overlapping for adjacent register bits, each register bit comprises a half-latch, and the additive latency provided by each half-latch has a duration of more than one-half of a clock cycle.

10. The method of claim 9, further comprising bypassing the chain of register bits when no additive latency is required.

11. The method of claim 10 further comprising disabling the chain of register bits.

12. The method of claim 9 wherein providing the chain of register bits comprises providing a first chain of register bits and providing a second chain of register bits.

13. The method of claim 12 wherein the first chain of register bits provides additive latency for address signals.

14. The method of claim 12 wherein the second chain of register bits provides additive latency for command signals.

15. The additive latency circuit of claim 14 further comprising resetting the second chain of register bits.

* * * * *